(12) United States Patent
Sugawara et al.

(10) Patent No.: US 11,249,233 B2
(45) Date of Patent: Feb. 15, 2022

(54) THIN FILM FOR OPTICAL ELEMENT, METHOD OF MANUFACTURING THIN FILM FOR OPTICAL ELEMENT, INORGANIC POLARIZING PLATE, METHOD OF MANUFACTURING INORGANIC POLARIZING PLATE, OPTICAL ELEMENT, AND OPTICAL DEVICE

(71) Applicant: Dexerials Corporation, Tokyo (JP)

(72) Inventors: Toshiaki Sugawara, Tokyo (JP); Akio Takada, Tokyo (JP)

(73) Assignee: Dexerials Corporation, Tokyo (JP)

( * ) Notice: Subject to any disclaimer, the term of this patent is extended or adjusted under 35 U.S.C. 154(b) by 54 days.

(21) Appl. No.: 16/840,726

(22) Filed: Apr. 6, 2020

(65) Prior Publication Data

US 2020/0326463 A1   Oct. 15, 2020

(30) Foreign Application Priority Data

Apr. 10, 2019  (JP) .............................. JP2019-074790

(51) Int. Cl.
| | |
|---|---|
| *G02B 5/30* | (2006.01) |
| *G02B 1/08* | (2006.01) |
| *C23C 14/34* | (2006.01) |
| *C23C 14/06* | (2006.01) |
| *G02F 1/03* | (2006.01) |

(52) U.S. Cl.
CPC ........ *G02B 5/3058* (2013.01); *C23C 14/0635* (2013.01); *C23C 14/34* (2013.01); *G02B 1/08* (2013.01); *G02F 1/0311* (2013.01)

(58) Field of Classification Search
None
See application file for complete search history.

(56) References Cited

U.S. PATENT DOCUMENTS

| | | | |
|---|---|---|---|
| 7,961,393 B2 | 6/2011 | Perkins et al. | |
| 10,436,964 B2 * | 10/2019 | Takada ..................... | G02B 1/14 |
| 2008/0225389 A1 * | 9/2008 | Oh ...................... | H01L 51/5281 |
| | | | 359/485.05 |
| 2014/0063467 A1 * | 3/2014 | Takahashi ............ | G02B 5/3058 |
| | | | 353/20 |
| 2015/0015948 A1 | 1/2015 | Takada et al. | |
| 2016/0054497 A1 * | 2/2016 | Takahashi ................ | C23F 1/12 |
| | | | 359/485.04 |
| 2016/0131810 A1 * | 5/2016 | Takada ................. | G02B 5/3041 |
| | | | 359/487.06 |
| 2018/0224589 A1 * | 8/2018 | Takada ..................... | G02B 1/14 |

FOREIGN PATENT DOCUMENTS

JP    2015034959 A    2/2015

* cited by examiner

*Primary Examiner* — Derek S. Chapel (74) *Attorney, Agent, or Firm* — Osha Bergman Watanabe & Burton LLP (57) ABSTRACT

Provided are a thin film for optical element as a single-layer thin film which contains a Si simple substance, a Si compound excluding Si alloy, and a metal or metal compound, a method of manufacturing the thin film for optical element, and an optical element including the thin film for optical element. Further provided are an inorganic polarizing plate including a reflection suppressing layer composed of the thin film for optical element, a method of manufacturing the inorganic polarizing plate, and an optical device including the inorganic polarizing plate.

11 Claims, 7 Drawing Sheets

(PRIOR ART)

THIN FILM FOR OPTICAL ELEMENT, METHOD OF MANUFACTURING THIN FILM FOR OPTICAL ELEMENT, INORGANIC POLARIZING PLATE, METHOD OF MANUFACTURING INORGANIC POLARIZING PLATE, OPTICAL ELEMENT, AND OPTICAL DEVICE

This application is based on and claims the benefit of priority from Japanese Patent Application No. 2019-074790, filed on 10 Apr. 2019, the content of which is incorporated herein by reference.

BACKGROUND OF THE INVENTION

Field of the Invention

The present invention relates to a thin film for optical element, a method of manufacturing the thin film for optical element, an inorganic polarizing plate, a method of manufacturing the inorganic polarizing plate, an optical element, and an optical device.

Related Art

A polarizing plate is an optical element that absorbs or reflects polarized light in one direction and transmits in a direction orthogonal to the one direction. In recent years, in optical devices such as liquid-crystal projectors that require heat resistance, wire grid type inorganic polarizing plates have been adopted instead of organic polarizing plates.

The wire grid type inorganic polarizing plates have a structure in which at least a reflective layer is provided and a plurality of grid-shaped convex portions extending in one direction are arranged on a transparent substrate at a pitch (several tens to several hundreds of nm) shorter than a wavelength of light in a use band. When light is incident to the inorganic polarizing plates, polarized light (TE wave (S wave)) having an electric field component parallel to the extending direction of the grid-shaped convex portion cannot be transmitted and polarized light (TM wave (P wave)) having an electric field component orthogonal to the extending direction of the grid-shaped convex portion is transmitted directly.

The inorganic polarizing plates include absorption type inorganic polarizing plates and reflection type inorganic polarizing plates, but in the case of the absorption type inorganic polarizing plate, high contrast, that is, low reflectance is regarded as an important factor for optical characteristics. When the reflectance of the inorganic polarizing plate is high, this may cause a malfunction of the optical device and may cause image quality deterioration due to stray light. Here, conventionally, inorganic polarizing plates having various structures have been proposed in order to suppress the reflectance to be low.

Figure 7:
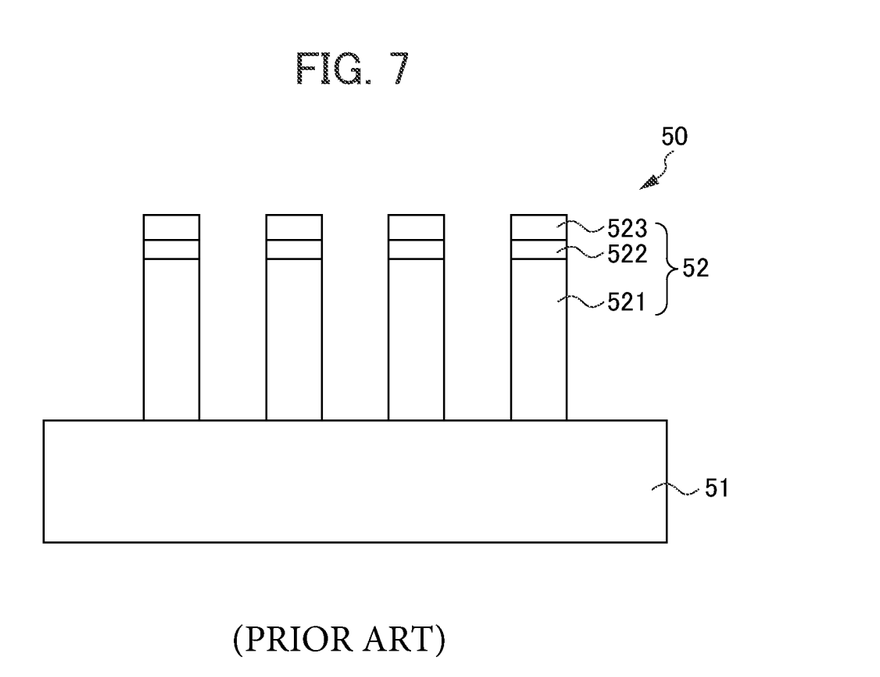
FIG. 7 is a schematic cross-sectional view illustrating an example of a conventional inorganic polarizing plate.

For example, Patent Document 1 discloses an inorganic polarizing plate having a structure illustrated in FIG. 7. An inorganic polarizing plate 50 illustrated in FIG. 7 includes a transparent substrate 51 and grid-shaped convex portions 52 arranged on the transparent substrate 51 at a pitch shorter than a wavelength of light in a use band, in which the grid-shaped convex portion 52 includes a reflective layer 521, a dielectric layer 522, and an absorption layer 523 in order from the side of the transparent substrate 51.

Further, Patent Document 2 discloses an inorganic polarizing plate including a transparent substrate and grid-shaped convex portions arranged on the transparent substrate at a pitch shorter than a wavelength of light in a use band, in which the grid-shaped convex portion includes a reflective layer, a dielectric layer, an absorption layer, and a dielectric layer in order from the side of the transparent substrate.

Patent Document 1: Japanese Unexamined Patent Application, Publication No. 2015-34959

Patent Document 2: U.S. Pat. No. 7,961,393

SUMMARY OF THE INVENTION

According to the inorganic polarizing plates having the structures of Patent Documents 1 and 2, the TE wave (S wave) can be attenuated and the TM wave (P wave) can be transmitted by the effects of absorption, interference, reflection, and the like in the reflective layer, the dielectric layer, and the absorption layer. However, it is preferable that the number of layers is small when considering the manufacturing cost and yield. Further, if the number of layers is large when forming the grid-shaped convex portions by etching, there is concern that a step is formed in a boundary portion and the optical characteristics are adversely affected. Also from this point, it is preferable that the number of layers is small.

The invention has been made in view of the above-described circumstances and an object of the invention is to provide a thin film for optical element as a single-layer thin film used for an optical element such as an absorption type inorganic polarizing plate, a method of manufacturing the thin film for optical element, an inorganic polarizing plate including the thin film for optical element, a method of manufacturing the inorganic polarizing plate, an optical element including the thin film for optical element, and an optical device including the inorganic polarizing plate.

In order to achieve the above-described object, the invention provides a thin film for optical element as a single-layer thin film, in which the thin film for optical element contains a Si simple substance, a Si compound excluding Si alloy, and a metal or metal compound.

In the thin film for optical element, a mixing ratio of the Si simple substance, the Si compound, and the metal or metal compound may change in a film thickness direction.

The Si compound may be a carbide and an oxide of Si.

The thin film for optical element may contain an oxide of Nb as the metal or metal compound.

Further, the invention provides a method of manufacturing the thin film for optical element, including: performing reactive sputtering in the presence of an oxidizing gas by using a carbide of Si and a metal or metal compound as a sputtering target.

Further, the invention provides an inorganic polarizing plate having a wire grid structure, including: a transparent substrate; and grid-shaped convex portions arranged on the transparent substrate at a pitch shorter than a wavelength or light in a use band, in which the grid-shaped convex portions include a reflective layer and a reflection suppressing layer composed of the thin film for optical element in order from the side of the transparent substrate.

A width of the reflection suppressing layer may be smaller than a width of the reflective layer.

The inorganic polarizing plate may further include a protective film which covers a surface of the grid-shaped convex portion.

The protective film may contain at least one of an inorganic oxide film and a fluorine-based water-repellent film.

Further, the invention provides a method of manufacturing an inorganic polarizing plate having a wire grid structure, including: forming a laminate having a reflective layer and a reflection suppressing layer composed of the thin film for optical element in this order from the side a transparent substrate on the transparent substrate; and forming grid-shaped convex portions arranged on the transparent substrate at a pitch shorter than a wavelength of light in a use band by selectively etching the laminate.

Further, the invention provides an optical element including the thin film for optical element.

Further, the invention provides as optical device including the inorganic polarizing plate.

According to the invention, it is possible to provide a thin film for optical element as a single-layer thin film used for as optical element such as an absorption type inorganic polarizing plate, a method of manufacturing the thin film for optical element, an inorganic polarizing plate including the thin film for optical element, a method of manufacturing the inorganic polarizing plate, an optical element including the thin film for optical element, and an optical device including the inorganic polarizing plate.

DETAILED DESCRIPTION OF THE INVENTION

Hereinafter, an embodiment of the invention will be described in detail with reference to the drawings.

[Thin Film for Optical Element]

A thin film for optical element according to the embodiment is a thin film for optical element as a single-layer thin film which contains a Si simple substance, a Si compound excluding Si alloy, and a metal or metal compound.

The Si simple substance and the Si compound in the thin film for optical element according to the embodiment can be obtained by performing, for example, reactive sputtering in the presence of an oxidizing gas using a sputtering target composed of $Si_xC$ (x=2.3±0.2). The composition of a Si compound in a thin film obtained by using a sputtering target composed of $Si_xC$ (x=2.3±0.2) is represented by $Si_aO_bC_c$. In a so-called metal mode in which the flow rate of the oxidizing gas is zero, a high refractive index component such as Si simple substance or SiC having a high C composition ratio is mainly used. Further, in a so-called reactive mode in which the flow rate of the oxidizing gas is relatively large, a low refractive index component such as $SiO_y$ (y≤2) having a large O composition ratio is mainly used. Additionally, when the flow rate of the oxidizing gas is relatively large, the C component in the target reacts with the oxidizing gas in the atmosphere during film formation to become $CO_2$ or CO and is exhausted by a vacuum pump or the like.

Examples of the metal or metal compound in the thin film for optical element according to the embodiment include, for example, a simple substance of at least one element selected from a group consisting of Nb, Fe, Ta, Si, Ti, Mg, W, Mo, and Al (however, excluding Si simple substance), an oxide or an alloy thereof (however, excluding oxide of Si), and the like. Examples of the alloy include NbSi alloy, FeSi alloy, TaSi alloy, and the like. One of these metal materials may be used alone or two or more thereof may be used in combination. Among these, oxides of Nb such as $NbO_x$ (x≤2.5) are preferable from the viewpoint of the heat resistance and the extinction coefficient of the thin film for optical element.

As will be described later, a thin film for optical element having desired optical characteristics can be obtained by adjusting a sputtering condition when forming the thin film for optical element and adjusting a composition ratio of C and O in the Si compound or a mixing ratio of the Si simple substance, the Si compound, and the metal or metal compound.

Table 1 below shows the refractive index and extinction coefficient at a wavelength of 550 nm of the main components that can be contained in the thin film for optical element according to the embodiment.

TABLE 1

| Component | Refractive index (550 nm) | Extinction coefficient |
| --- | --- | --- |
| Si | 4.09 | $4.1 \times 10^{-2}$ |
| SiC | 3.43 | $3.7 \times 10^{-1}$ |
| SiO | 1.98 | $4.8 \times 10^{-3}$ |
| $SiO_2$ | 1.47 | $1.9 \times 10^{-3}$ |
| $Nb_2O_5$ | 2.36 | $3.0 \times 10^{-5}$ |

As the thin film for optical element according to the embodiment, for example, one in which the content of $NbO_x$ (x≤2.5) is 1 atm % to 20 atm %, the content of $SiO_y$ (y≤2) is 0 atm % to 30 atm %, the content of Si simple substance is 15 atm % to 80 atm %, and the content of SiC is 15 atm % to 80 atm % can be used and each content is adjusted in response to desired optical characteristics.

In the thin film for optical element according to the embodiment, a mixing ratio of the Si simple substance, the Si compound, and the metal or metal compound may be changed in the film thickness direction. For example, the ratio of the low refractive index component (oxide of Si or the like) is relatively large on the side of the substrate provided with the thin film for optical element and the ratio of the high refractive index component (Si C, $NbO_x$, or the like) is relatively large on the side opposite to the substrate. Alternatively, the film may be formed so that the ratio between the low refractive index component and the high refractive index component changes continuously and this change is repeated.

The film thickness of the thin film for optical element according to the embodiment is, for example, 10 nm to 1000 nm and is arbitrarily selected depending on the intended use. The film thickness of the thin film for optical element can be easily adjusted by adjusting the sputtering time of the reactive sputtering to be described below.

Further, the center wavelength at which the reflectance becomes minimal can be shifted to a desired wavelength by adjusting the film thickness of the thin film for optical element. Additionally, in the thin film for optical element according to the embodiment, the drift, of the overall reflectance tends to hardly occur even when the center wavelength of the reflectance is shifted by changing the film thickness.

[Method of Manufacturing Thin Film for Optical Element]

The thin film for optical element according to the embodiment can be manufactured by, for example, a method including performing reactive sputtering in the presence of an oxidizing gas using, for example, a carbide of Si and a metal or metal compound as a sputtering target.

As a carbide of Si which is a sputtering target, $Si_xC$ (x=2.3±0.2) is preferable. By using such a sputtering target, a thin film for optical element containing a carbide and an oxide of Si can be easily obtained. Additionally, the sputtering target composed of $Si_xC$ (x=2.3±0.2) can be manufactured by mixing and sintering, for example, 1 part by mass of SiC powder and 1.1 parts by mass to 1.5 parts by mass of Si powder.

When sputtering the carbide of Si which is the sputtering target, the output of the sputtering power supply is preferable such that LF power is 5 kW to 10 kW and RF power is 0 kW to 5 kW.

The metal or metal compound which is the sputtering target is appropriately selected in response to the type of metal or metal compound contained in the thin film for optical element. For example, when the thin film for optical element contains $NbO_x$ (x≤2.5), a sputtering target composed of Nb simple substance or $NbO_x$ (1.0≤x≤2.5) can be used. Among these, it is preferable to use the sputtering target composed of $NbO_x$ (1.0≤x≤2.5) from the viewpoint of the film forming speed.

When sputtering the metal or metal compound which is the sputtering target, the output of the sputtering power supply is preferably set such that LF power is 0.4 kW to 10 kW and RF power is 0 kW to 5 kW.

A process gas used in the reactive sputtering is not particularly limited as long as an oxidizing gas is contained and, for example, a mixture gas of an oxidizing gas and an inert gas is used. Examples of the oxidizing gas include gases such as oxygen and ozone. Further, examples of the inert gas include gases such as helium, neon, argon, krypton, and xenon.

In the method of manufacturing the thin film for optical element according to the embodiment, the composition ratio of the Si compound in the thin film can be arbitrarily controlled by adjusting the gas amount of the oxidizing gas to adjust the concentration of the oxidizing gas. For example, the high refractive index component containing SiC as a main component can be increased by performing the reactive sputtering in the presence of the low-concentration oxidizing gas atmosphere using $Si_xC$ (x=2.3±0.2) which is a single sputtering target and the low refractive index component containing $SiO_2$ as a main component can be increased by performing the reactive sputtering in the presence of the high-concentration oxidizing gas atmosphere. Examples of the low-concentration oxidizing gas atmosphere include, for example, a mixed gas atmosphere having an Ar gas flow rate of 100 sccm to 1000 sccm and an $O_2$ gas flow rate of 0 sccm to 100 sccm. Further, examples of the high-concentration oxidizing gas atmosphere include, for example, a mixed gas atmosphere having an Ar gas flow rate of 100 sccm to 1000 sccm and an $O_2$ gas flow rate of 120 sccm to 200 sccm.

A reactive sputtering apparatus used to manufacture the thin film for optical element is not particularly limited as long as dual simultaneous reactive sputtering can be performed. Examples of the reactive sputtering method include a radical assist sputtering method, a meta mode method, and the like.

Figure 1:
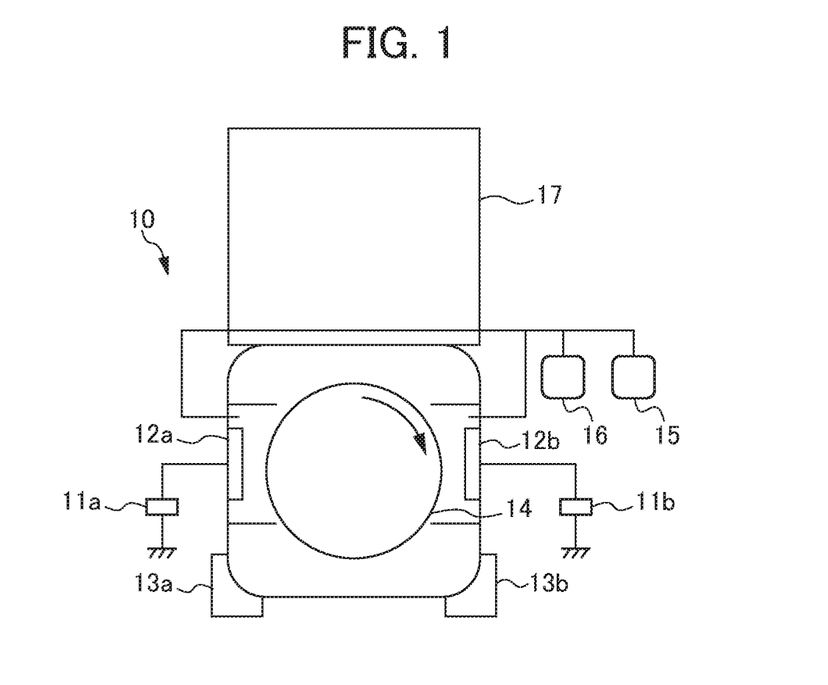
FIG. 1 is a schematic diagram illustrating an example of a reactive sputtering apparatus.

An example of the reactive sputtering apparatus is illustrated in a schematic view of FIG. 1. A reactive sputtering apparatus 10 illustrated in FIG. 1 includes sputtering power supplies 13a and 13b, sputtering targets 12a and 12b, exhaust pumps 13a and 13b, a cylindrical substrate holder 14, an inert gas supply source 15, an oxidizing gas supply source 16, and a load lock chamber 17. The reactive sputtering apparatus 10 may further include a radical oxidation source, an oxidation source power supply, and the like (all not illustrated).

When manufacturing the thin film for optical element according to the embodiment, for example, $Si_xC$ (x=2.3±0.2) is used as the sputtering target 12a. Further, for example, $NbO_x$ (1.0≤x≤2.5) is used as the sputtering target 12b. Then, the thin film for optical element according to the embodiment can be formed on a substrate by setting the substrate to the cylindrical substrate holder 14 and performing the reactive sputtering while rotating the cylindrical substrate holder 14 at the speed of about 10 rpm to 50 rpm.

Additionally, when the mixing ratio of the Si simple substance, the Si compound, and the metal or metal compound in the thin film for optical element is changed in the film thickness direction, the output of the sputtering power supplies 11a and 11b, the ratio between the inert gas and the oxidizing gas, or the like may be changed during a film forming operation.

[Optical Element]

The optical element according to the embodiment includes the thin film for optical element according to the embodiment. Examples of the optical element according to the embodiment include an inorganic polarizing plate, an antireflection film, a color filter, and the like. Among these, the inorganic polarizing plate is preferable.

[Inorganic Polarizing Plate]

An inorganic polarizing plate according to the embodiment is an inorganic polarizing plate having a wire grid structure, including: a transparent substrate; and grid-shaped convex portions arranged on the transparent substrate at a pitch shorter than a wavelength of light in a use band, in which the grid-shaped convex portions include a reflective layer and a reflection suppressing layer composed of the thin film for optical element according to the embodiment in order from the side of the transparent substrate.

Figure 2:
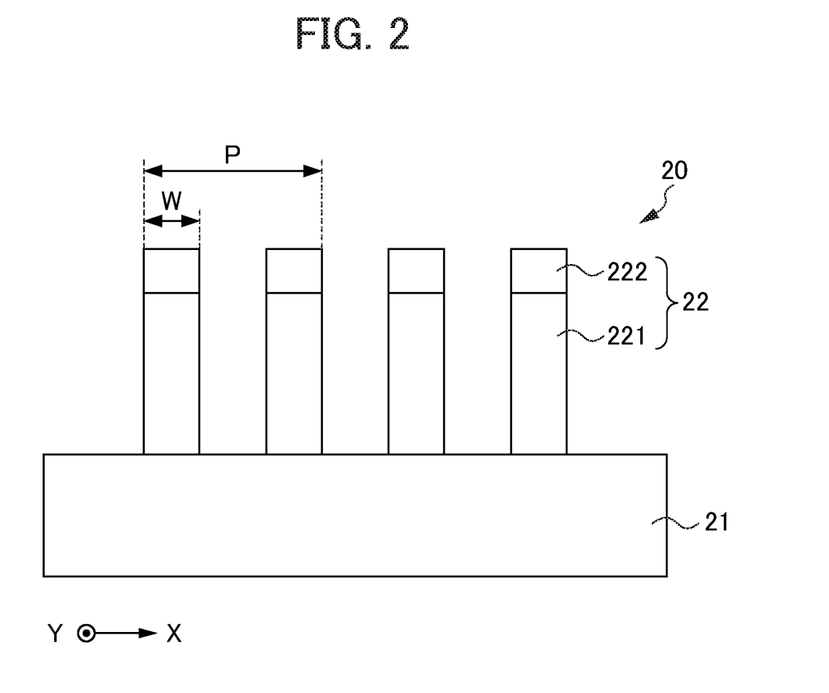
FIG. 2 is a schematic cross-sectional view illustrating an example of an inorganic polarizing plate according to the embodiment.

FIG. 2 is a schematic cross-sectional view illustrating an example of the inorganic polarizing plate according to the embodiment. As illustrated in FIG. 2, an inorganic polarizing plate 20 includes a transparent substrate 21 and grid-shaped convex portions 22 arranged on one surface of the transparent substrate 21 at a pitch shorter than a wavelength of light in a use band and extending in a predetermined direction. The grid-shaped convex portion 22 includes a reflective layer 221 and a reflection suppressing layer 222 in this order from the side of the transparent substrate 21. That is, the inorganic polarizing plate 20 has a wire grid structure in which the grid-shaped convex portions 22 each formed by laminating the reflective layer 221 and the reflection suppressing layer 222 in this order from the side of the transparent substrate 21 are arranged on the transparent substrate 21 in one-dimensional grid-shape.

In the present specification, as illustrated in FIG. 2, the extending direction of the grid-shaped convex portion 22 is referred to as the Y-axis direction. Further, the direction which is orthogonal to the Y-axis direction and in which the grid-shaped convex portions 22 are arranged along the principal surface of the transparent substrate 21 is referred to as the X-axis direction. In this case, light incident to the inorganic polarizing plate 20 is preferably incident from the direction orthogonal to the X-axis direction and the Y-axis direction on the formation side of the grid-shaped convex portion 22 of the transparent substrate 21.

The inorganic polarizing plate 20 uses the effects of absorption, interference, reflection, and the like so as to attenuate polarized light (TE wave (S wave)) having an electric field component parallel to the Y-axis direction and to transmit polarized light (TM wave (P wave)) having an electric field component parallel to the X-axis direction. Thus, the Y-axis direction is the direction of the absorption axis of the inorganic polarizing plate 20 and the X-axis direction is the direction of the transmission axis of the inorganic polarizing plate 20.

As the transparent substrate 21, a substrate that transmits light in a use band is used. "Transmits light in a use band" does not mean that the transmittance of the light in a use band is 100%, but may mean the translucency capable of retaining the function as the inorganic polarizing plate. Examples of the light in a use band include visible light having a wavelength of about 380 nm to 810 nm.

As a material forming the transparent substrate 21, a material having a refractive index of 1.1 to 2.2 is preferable and examples thereof include glass, quartz, and sapphire. As a material forming the transparent substrate 21, glass is more preferable from the viewpoint of cost and translucency.

The shape of the principal surface of the transparent substrate 21 is not particularly limited and a shape (for example, a rectangular shape) according to the purpose is appropriately selected. An average thickness of the transparent substrate 21 is preferably, for example, 0.3 mm to 1 mm.

The grid-shaped convex portions 22 are arranged on the transparent substrate 21 at a pitch P shorter than the wavelength of light in a use band. The pitch P of the grid-shaped convex portions 22 is not particularly limited as long as the pitch is shorter than the wavelength of light in a use band. From the viewpoint of ease of production and stability, the pitch P of the grid-shaped convex portions 22 is preferably, for example, 100 nm to 200 nm. The pitch P of the grid-shaped convex portions 22 can be measured by the observation using a scanning electron microscope or a transmission electron microscope. For example, the pitch at four arbitrary positions can be measured using a scanning electron microscope or a transmission electron microscope and the arithmetic average value can be used as the pitch of the grid-shaped convex portions 22. Hereinafter, this measuring method is referred to as electron microscopy method.

The width W of the grid-shaped convex portion 22 is not particularly limited, but from the viewpoint of suppressing re-deposition when forming the grid-shaped convex portion 22 by etching, the width is preferably smaller than the width of the concave portion between the grid-shaped convex portions 22. Specifically, the width W of the grid-shaped convex portion 22 is preferably, for example, 35 nm to 45 nm. The width W of the grid-shaped convex portion 22 can be measured by the above-described electron microscopy method at the center position of the height of the grid-shaped convex portion 22.

The reflective layer 221 constituting the grid-shaped convex portion 22 is formed on the transparent substrate 21 and is formed by arranging strip-shaped metal films extending in the Y-axis direction corresponding to the absorption axis. The reflective layer 221 has a function as a wire grid polarizer, attenuates a polarized wave (TE wave (S wave)) having an electric field component in a direction parallel to the longitudinal direction of the reflective layer 221, and transmits a polarized wave (TM wave (P wave)) having an electric field component in a direction orthogonal to the longitudinal direction of the reflective layer 221.

The material forming the reflective layer 221 is not particularly limited as long as the material has reflectivity for light in a use band and examples thereof include a simple substance such as Al, Ag, Cu, Mo, Cr, Ti, Ni, W, Fe, Si, Ge, and Te and alloys containing one or more of these elements. Among these, the reflective layer 221 is preferably composed of Al, Al alloy, or Ag.

The film thickness of the reflective layer 221 is preferably, for example, 100 nm to 300 nm. The film thickness of the reflective layer 221 can be measured by, for example, the above-described electron microscopy method.

The reflection suppressing layer 222 constituting the grid-shaped convex portion 22 is composed of the thin film for optical element according to the embodiment and is laminated on the reflective layer 221. Since the thin film for optical element has been described above, a detailed description will be omitted.

The film thickness of the reflection suppressing layer 222 is not particularly limited as long as the film thickness is thinner than the film thickness of the reflective layer 221 and is preferably, for example, 10 nm to 100 nm. The film thickness of the reflection suppressing layer 222 can be measured by, for example, the above-described electron microscopy method.

Additionally, in FIG. 2, the width of the reflective layer 221 and the width of the reflection suppressing layer 222 are set to the substantially same dimension, but the invention is not limited to this configuration. The width of the reflection suppressing layer 222 may be smaller than the width of the reflective layer 221. With such a configuration, the transmittance of the inorganic polarizing plate 20 tends to be further improved.

The inorganic polarizing plate 20 may further include a protective (not illustrated) which covers the surface of the grid-shaped convex portion 22 if necessary. Since the inorganic polarizing plate 20 includes the protective film, there is a tendency that reliability such as moisture resistance is further improved.

Examples of the protective film include a film containing at least one of an inorganic oxide film and a fluorine-based water-repellent film. Examples of the inorganic oxide film include a Si oxide film and an Hf oxide film. Examples of the fluorine-based water-repellent film include a film formed by applying a fluorine-based silane compound such as perfluorodecyltriethoxysilane (FDTS). The protective film can be formed by using a CVD method (chemical vapor deposition method), an ALD method (atomic layer deposition method), or the like.

[Method of Manufacturing Inorganic Polarizing Plate]

The inorganic polarizing plate according to the embodiment can be manufactured by a method including: forming a laminate having a reflective layer and a reflection suppressing layer composed of the thin film for optical element according to the above-described embodiment in this order from the side of a transparent substrate on the transparent substrate; and forming grid-shaped convex portions arranged on the transparent substrate at a pitch shorter than a wavelength of light in a use band by selectively etching the laminate.

Hereinafter, as an example, a method of manufacturing an inorganic polarizing plate having a structure illustrated in FIG. 2 will be described.

First, a reflective layer is formed on a transparent substrate. Examples of a method of forming the reflective layer include a sputtering method, a vapor deposition method, and the like.

Next, a reflection suppressing layer is formed on the reflective layer. Since a method of forming the reflection suppressing layer is the same as the method of manufacturing the thin film for optical element according to the embodiment, a detailed description will be omitted.

Next, a one-dimensional lattice-shaped mask pattern is formed on the reflection suppressing layer by a photolithography method, a nanoimprint method, or the like. Then, grid-shaped convex portions arranged on the transparent substrate at a pitch shorter than a wavelength of light in a use band are formed by selectively etching a laminate including the reflective layer and the reflection suppressing layer. Examples of the etching method include a dry etching method using an etching gas corresponding to an etching target.

An inorganic polarizing plate having a structure illustrated in FIG. 2 can be manufactured by the above-described method. Additionally, the method of manufacturing the inorganic polarizing plate according to the embodiment may further include coating the surface of the grid-shaped convex portion with a protective film.

[Optical Device]

The optical device according to the embodiment includes the inorganic polarizing plate according to the embodiment. Examples of the optical device according to the embodiment include a liquid-crystal projector, a head-up display, a digital camera, and the like. Since the inorganic polarizing plate according to the embodiment is superior in heat resistance compared to the organic polarizing plate, it is suitable for applications such as liquid-crystal projectors and head-up displays that require heat resistance.

When the optical device according to the embodiment includes a plurality of inorganic polarizing plates, at least one of the plurality of inorganic polarizing plates may be the inorganic polarizing plate according to the embodiment. For example, when the optical device according to the embodiment is a liquid-crystal projector, at least one of the inorganic polarizing plates disposed on the light incident side and the light emitting side of the liquid-crystal panel may be the inorganic polarizing plate according to the embodiment.

Additionally, the invention is not limited to the above-described embodiment and modifications and improvements are included in the invention in the range capable of achieving the object of the invention.

EXAMPLES

Next, examples of the invention will be described, but the invention is not limited to these examples.

Example 1

First, a reflective layer (Al film) having a film thickness of 250 nm was formed on a glass substrate by a sputtering method. Next, a reflection suppressing layer having a film thickness of 50 nm was formed on the reflective layer using the reactive sputtering apparatus 10 having a configuration illustrated in FIG. 1 to thereby obtain a test plate of Example 1.

Details of the reactive sputtering are as below. $Si_xC$ (x=2.3±0.2) was used as the sputtering target 12a, the output of the sputtering power supply 11a was set to 6000 W, the flow rate of the Ar gas was set to 150 sccm, and the flow rate of the $O_2$ gas was set to 10 sccm. Further, $NbO_x$ (1.0≤x≤2.5) was used as the sputtering target 12b, the output of the sputtering power supply 11b was set to 1000 W, the flow rate of the Ar gas was set to 200 sccm, and the flow rate of the $O_2$ gas was set to 10 sccm. Then, the glass substrate having the Al film formed thereon was set to the cylindrical substrate holder 14 and the reactive sputtering was performed while rotating the cylindrical substrate holder 14 at the speed of 30 rpm. The obtained reflection suppressing layer contained 20 atm % to 30 atm % of SiC, 20 atm % to 30 atm % of Si, 30 atm % to 50 atm % of Si oxide containing $SiO_2$ as a main component, and about 10 atm % of $NbO_x$ (x≤2.5).

Comparative Example 1

First, a reflective layer (Al film) having a film thickness of 250 nm was formed on a glass substrate by a sputtering method. Next, a dielectric layer ($SiO_2$ film) having a film thickness of 25 nm was formed on the reflective layer by a sputtering method. Next, an absorption layer (FeSi film (Fe=5 atm %)) having a film thickness of 25 nm was formed on the dielectric layer by a sputtering method to thereby obtain a test plate of Comparative Example 1.

<Evaluation>

Figure 3:
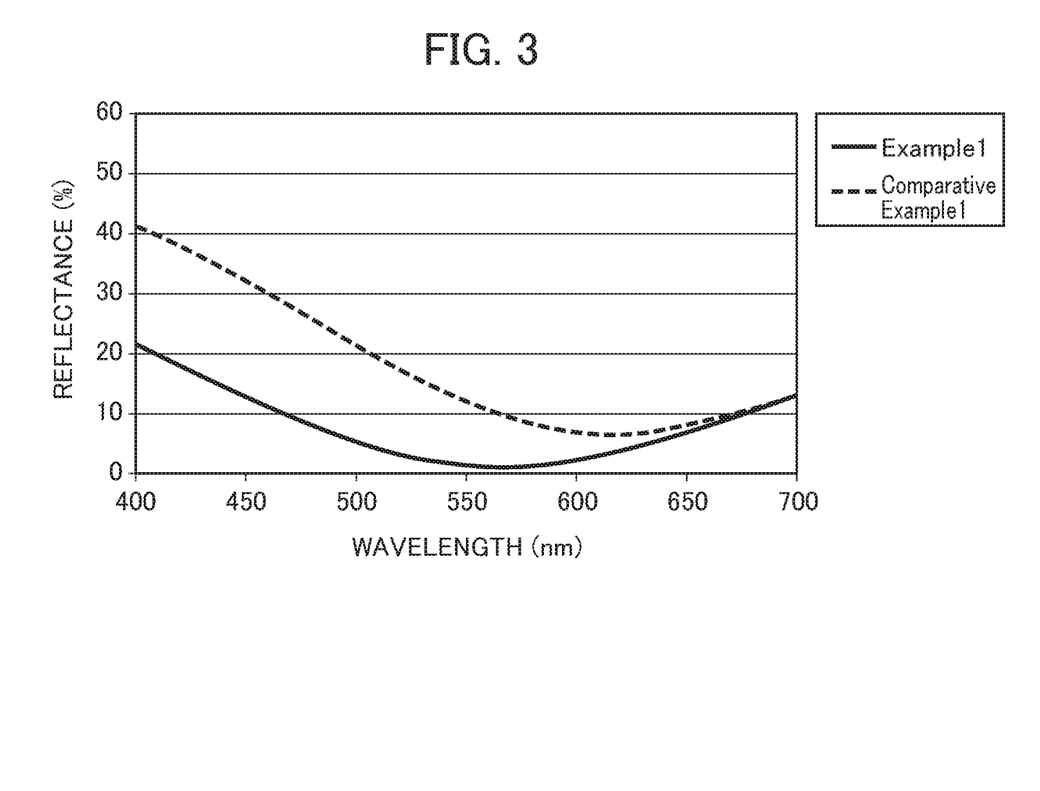
FIG. 3 is a graph showing measurement results of the reflectance of test plates of Example 1 and Comparative Example 1.

FIG. 3 shows the reflectance of the test plates of Example 1 and Comparative Example 1 when light is emitted from the film formation surface. As shown in FIG. 3, the test plate of Example 1 having the reflection suppressing layer as the single-layer thin film could suppress the reflectance to be lower than that of the test plate of Comparative Example 1 having the dielectric layer and the absorption layer.

Example 2

A test plate of Example 2 was obtained similarly to Example 1 except that the sputtering time of the reactive sputtering was 150 seconds. The film thickness of the obtained reflection suppressing layer was 30 nm.

Example 3

A test plate of Example 3 was obtained similarly to Example 1 except that the sputtering time of the reactive sputtering was 250 seconds. The film thickness of the obtained reflection suppressing layer was 60 nm.

<Evaluation>

Figure 4:
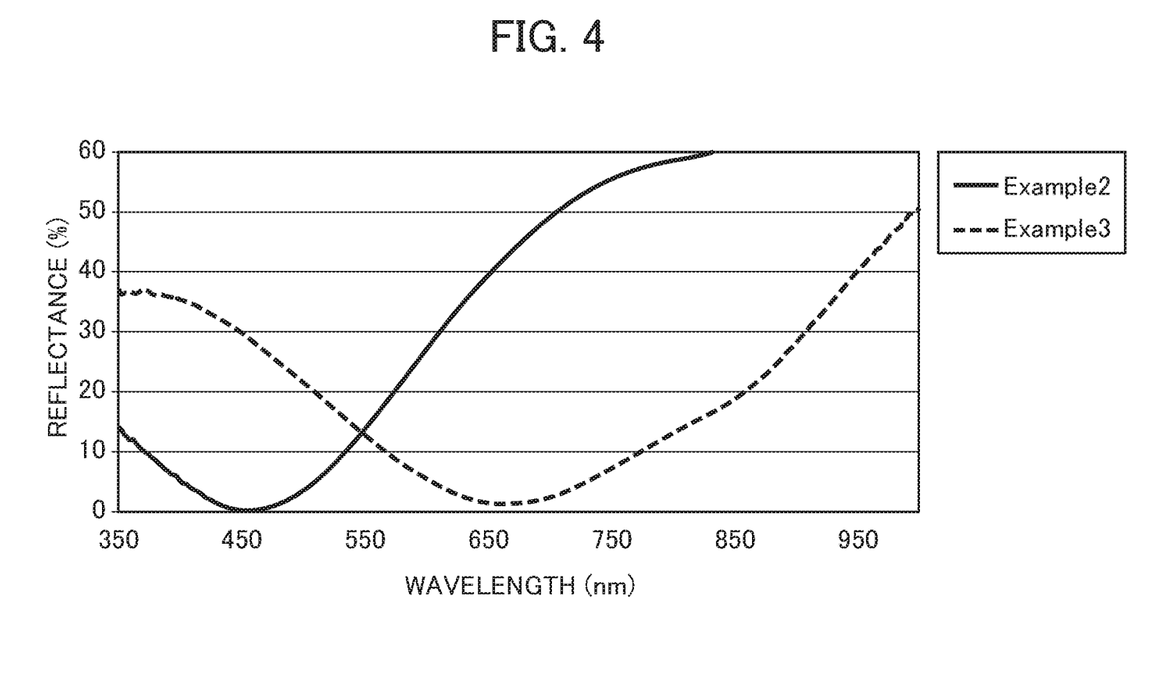
FIG. 4 is a graph showing measurement results of the reflectance of test plates of Examples 2 and 3.

FIG. 4 shows the reflectance of the test plates of Examples 2 and 3 when light is emitted from the film formation surface. As shown in FIG. 4, the center wavelength having minimal reflectance could be shifted by changing the sputtering time to change the film thickness. Further, the drift of the overall reflectance didn't occur even when the center wavelength of the reflectance was shifted by changing the film thickness.

Comparative Example 2

First, a dielectric layer ($SiO_2$ film) having a film thickness of 25 nm was formed on a glass substrate by a sputtering method. Next, an absorption layer (FeSi film (Fe=5 atm %)) having a film thickness of 25 nm was formed on the dielectric layer by a sputtering method to thereby obtain a test plate of Comparative Example 2.

<Evaluation>

Figure 5A:
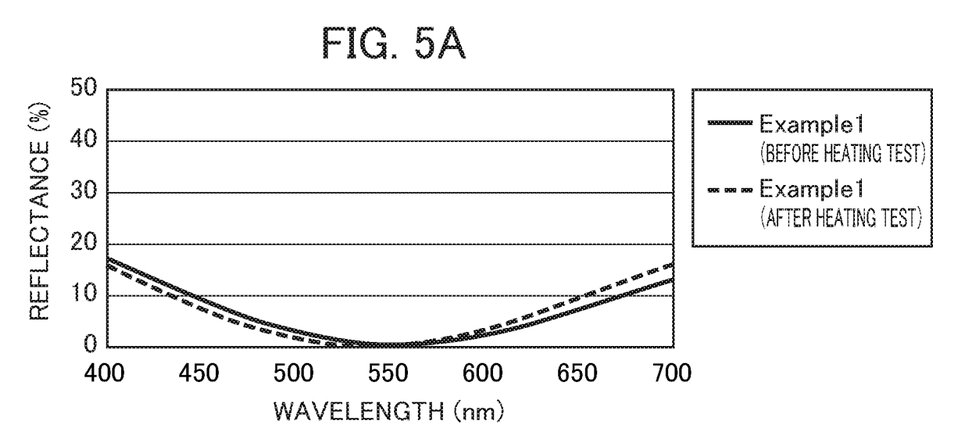
FIG. 5A is a graph showing measurement results of the reflectance of the test plate of Example 1 before and after a heating test.
Figure 5B:
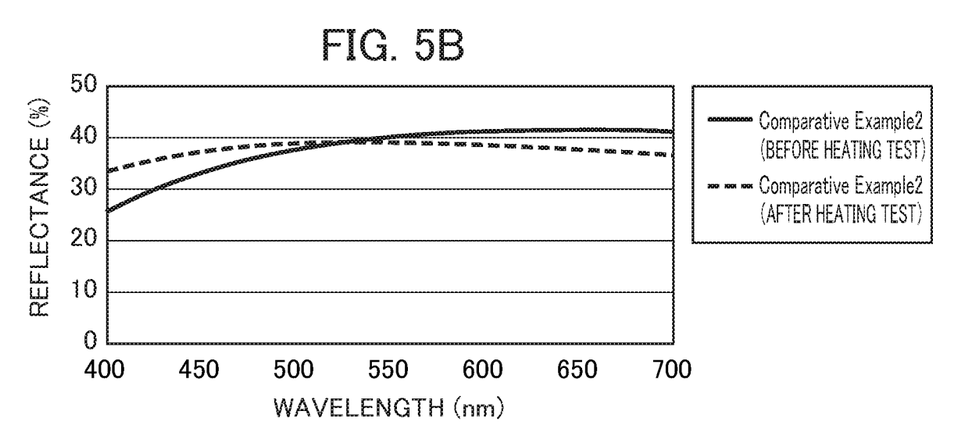
FIG. 5B is a graph showing measurement results of the reflectance of the test plate of Comparative Example 2 before and after a heating test.

The reflectance of the test plates of Example 1 and Comparative Example 2 irradiated with light from the side of the film formation surface was measured. Further, the test plates of Example 1 and Comparative Example 2 were heated at 300° C. for 15 minutes and the reflectance was measured in the same way. FIG. 5A shows the reflectance of the test plate of Example 1 before and after a heating test and FIG. 5B shows the reflectance of the test plate of Comparative Example 2 before and after a heating test. As shown in FIGS. 5A and 5B, the test plate of Example 1 having the reflection suppressing layer as the single-layer thin film had a little variation in reflectance due to heating and excellent heat resistance compared to the test plate of Comparative Example 2 having the dielectric layer and the absorption layer.

Example 4

First, a reflective layer (Al film) having a film thickness of 250 nm was formed on a glass substrate by a sputtering method. Next, a reflection suppressing layer having a film thickness of 64 nm was formed on the reflective layer by using the reactive sputtering apparatus 10 having a configuration illustrated in FIG. 1 to thereby obtain a test plate of Example 4.

Details of the reactive sputtering are as below. $Si_xC$ (x=2.3±0.2) was used as the sputtering target 12a and the gas flow rate was adjusted in the range shown in Table 2 below. The target output was set to increase from a lower limit value shown in Table 2 below and to decrease to the lower limit value after reaching a maximum output corresponding to an upper limit value. Further, $NbO_x$ (1.0≤x≤2.5) was used as the sputtering target 12b and the gas flow rate was adjusted in the range shown in Table 2 below. The target output was set to increase from a lower limit value shown in Table 2 below and to decrease to the lower limit value after reaching a maximum output corresponding to an upper limit value. The glass substrate having the Al film formed thereon was set to the cylindrical substrate holder 14 and the reactive sputtering was performed while rotating the cylindrical substrate holder 14 at the speed of 30 rpm. In the obtained reflection suppressing layer, only Si oxides containing $SiO_2$ as a main component were contained at both ends on the substrate side and on the side opposite to the substrate and about 20 atm % to 30 atm % of SiC and about 20 atm % of $NbO_x$ (x≤2.5) were contained at a height position of about 40 nm from the glass substrate.

TABLE 2

|  | $Si_xC$ | $NbO_x$ |
| --- | --- | --- |
| Ar gas flow rate (sccm) | 150 to 250 | 200 to 250 |
| $O_2$ gas flow rate (sccm) | 10 to 20 | 10 to 20 |
| Target output (W) | 2000 to 6000 | 0 to 1500 |

Example 5

A test plate of Example 5 was obtained similarly to Example 4 except that the maximum output of the sputtering power supply 11b was 500 W. In the obtained reflection suppressing layer, only Si oxides containing $SiO_2$ as a main component were contained at both ends on the substrate side and the side opposite to the substrate and about 20 atm % to 30 atm % of SiC and about 4 atm % of $NbO_x$ (x≤2.5) were contained at a height position of about 40 nm from the glass substrate.

<Evaluation>

Figure 6A:
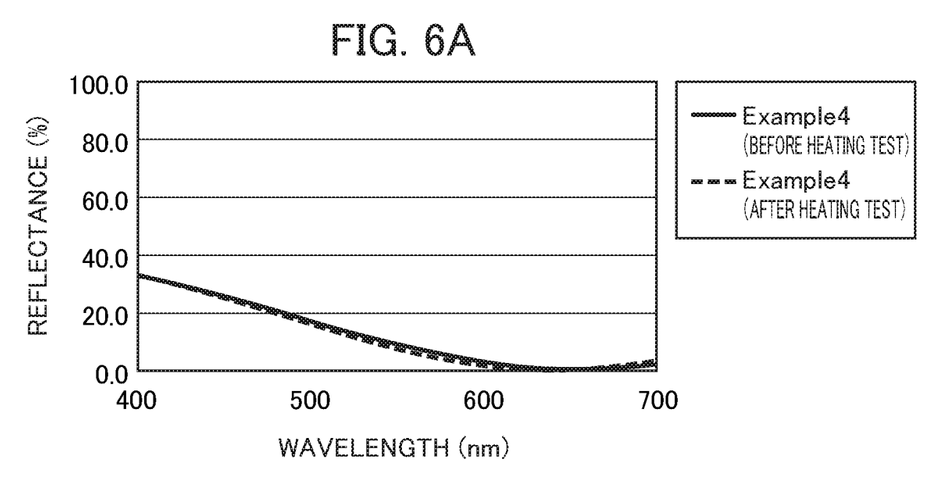
FIG. 6A is a graph showing measurement results of the reflectance of a test plate of Example 4 before and after a heating test.
Figure 6B:
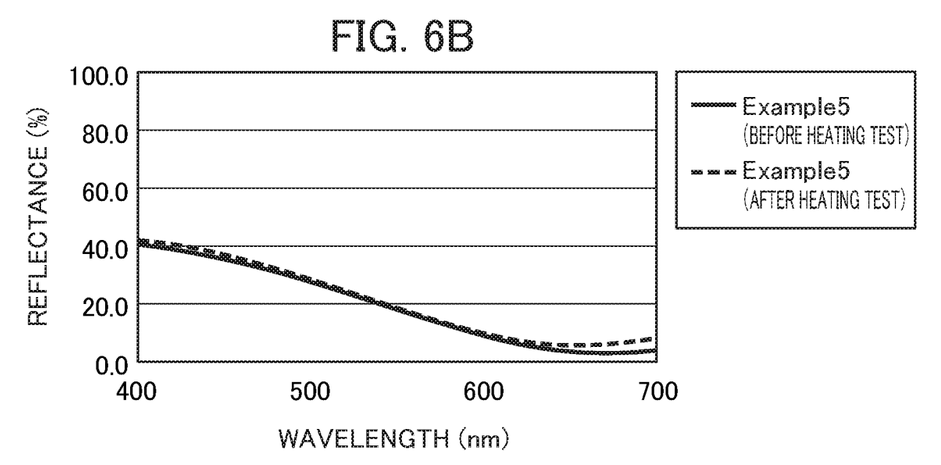
FIG. 6B is a graph showing measurement results of the reflectance of a test plate of Example 5 before and after a heating test.

The reflectance of the test plates of Examples 4 and 5 irradiated with light from the side of the film formation surface was measured. Further, the test plates of Examples 4 and 5 were heated at 300° C. for 15 minutes and the reflectance was measured in the same way. FIG. 6A shows the reflectance of the test plate of Example 4 before and after a heating test and FIG. 6B shows the reflectance of the test plate of Example 5 before and after a heating test. As shown in FIGS. 6A and 6B, the test plate of Example 4 having a relatively high content of $NbO_x$ in the reflection suppressing layer had a little variation in reflectance due to heating and excellent heat resistance compared to the test plate of Example 5 having a relatively low content of $NbO_x$ in the reflection suppressing layer.

EXPLANATION OF REFERENCE NUMERALS

10: reactive sputtering apparatus
11a, 11b: sputtering power supply
12a, 12b: sputtering target
13a, 13b: exhaust pump
14: cylindrical substrate holder
15: inert gas supply source
16: oxidizing gas supply source
17: load lock chamber
20: inorganic polarizing plate
21: transparent substrate
22: grid-shaped convex portion
221: reflective layer
222: reflection suppressing layer

What is claimed is:

1. A thin film for optical element as a single-layer thin film,
   wherein the thin film for optical element contains a Si simple substance, a Si compound excluding Si alloy, and a metal or metal compound,
   wherein the Si compound is a carbide and an oxide of Si, and
   wherein a composition ratio of the carbide of Si and the oxide of Si changes in a film thickness direction.

2. The thin film for optical element according to claim 1, wherein a mixing ratio of the Si simple substance, the Si compound, and the metal or metal compound changes in a film thickness direction.

3. The thin film for optical element according to claim 1, wherein an oxide of Nb is contained as the metal or metal compound.

4. A method of manufacturing the thin film for optical element according to claim 1, comprising:
   performing reactive sputtering in a presence of an oxidizing gas, while changing a gas amount of the oxidizing gas, by using a carbide of Si and a metal or metal compound as a sputtering target.

5. An inorganic polarizing plate having a wire grid structure, comprising:
   a transparent substrate; and
   grid-shaped convex portions arranged on the transparent substrate at a pitch shorter than a wavelength of light in a use band,
   wherein the grid-shaped convex portions include a reflective layer and a reflection suppressing layer composed of the thin film for optical element according to claim 1 in order from a side of the transparent substrate.

6. The inorganic polarizing plate according to claim 5, wherein a width of the reflection suppressing layer is smaller than a width of the reflective layer.

7. The inorganic polarizing plate according to claim 5, further comprising a protective film which covers a surface of the grid-shaped convex portion.

8. The inorganic polarizing plate according to claim 7, wherein the protective film contains at least one of an inorganic oxide film and a fluorine-based water-repellent film.

9. An optical device comprising the inorganic polarizing plate according to claim 5.

10. A method of manufacturing an inorganic polarizing plate having a wire grid structure, comprising:
  forming a laminate having a reflective layer and a reflection suppressing layer composed of the thin film for optical element according to claim 1 in this order from a side of a transparent substrate on the transparent substrate; and
  forming grid-shaped convex portions arranged on the transparent substrate at a pitch shorter than a wavelength of light in a use band by selectively etching the laminate.

11. An optical element comprising the thin film for optical element according to claim 1.

* * * * *